United States Patent
Kanamori

(10) Patent No.: US 6,869,849 B2
(45) Date of Patent: Mar. 22, 2005

(54) SEMICONDUCTOR DEVICE AND ITS MANUFACTURING METHOD

(75) Inventor: Kohji Kanamori, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/032,764

(22) Filed: Oct. 22, 2001

(65) Prior Publication Data

US 2002/0055217 A1 May 9, 2002

(30) Foreign Application Priority Data

Oct. 25, 2000 (JP) .......................................... 2000-325656

(51) Int. Cl.$^7$ ............................................. H01L 31/336
(52) U.S. Cl. ........................ 438/296; 438/259; 438/443
(58) Field of Search ................. 438/259, 221, 438/296, 426, 443, FOR 227, FOR 229

(56) References Cited

U.S. PATENT DOCUMENTS

| | | | | |
|---|---|---|---|---|
| 4,679,304 A | * | 7/1987 | Bois ............................ | 438/426 |
| 5,106,772 A | * | 4/1992 | Lai ............................. | 438/263 |
| 5,693,542 A | * | 12/1997 | Suh et al. .................... | 438/151 |
| 5,731,221 A | * | 3/1998 | Kwon ......................... | 438/426 |
| 6,033,969 A | * | 3/2000 | Yoo et al. .................... | 438/425 |
| 2001/0011759 A1 | * | 8/2001 | Rho et al. ................... | 257/510 |

FOREIGN PATENT DOCUMENTS

| | | | | |
|---|---|---|---|---|
| GB | 2077993 A | * | 12/1981 | ........... H01L/29/62 |
| JP | 62216268 A | * | 9/1987 | ........... H01L/29/78 |
| JP | 11-026731 | | 1/1999 | |
| KR | 2000-0053531 | | 8/2000 | |

OTHER PUBLICATIONS

English Bibliography and Abstract of JP 11–026731 (noted above).

* cited by examiner

Primary Examiner—George Fourson
(74) Attorney, Agent, or Firm—Darryl G. Walker; Bradley T. Sako

(57) ABSTRACT

A semiconductor device including memory cells isolated by a trench that may be self aligned with a stacked film pattern (7) has been disclosed. The memory cells may be flash memory cells having an active gate film (2) that may be thinner than a gate oxide film (30). The active gate film (2) may be located in a central portion under of a gate electrode (3). The gate oxide film (30) may be located under end portions of the gate electrode (3). In this way, a distance between a shoulder portion of a trench (11) and a gate electrode (3) may be increased. Thus, an electric field concentration in the shoulder portion of the trench (11) may be decreased and memory cell characteristics may be improved.

13 Claims, 14 Drawing Sheets

SEMICONDUCTOR DEVICE AND ITS MANUFACTURING METHOD

TECHNICAL FIELD

The present invention relates generally to a semiconductor device and its manufacturing method and more particularly to a semiconductor device having element isolation using a trench that can be self-aligned with a stacked film pattern formed in a cell.

BACKGROUND OF THE INVENTION

A flash memory cell using a method in which a trench that is self-aligned with a stacked film pattern formed in the memory cell is used in element isolation has advantages that allow the distance between adjacent memory cells to be minimized so that the memory cells can be more densely arranged.

Such a method is disclosed in Japanese Patent Application 11-26731 (JPA 11-26731) and is illustrated in FIG. 14. FIGS. 14(a)–(c) are cross sections of a conventional semiconductor device after various processing steps.

Referring now to FIG. 14(a), a stacked film of a tunnel oxide film 204, a first floating gate electrode 203, and a nitride film 205 is formed on a semiconductor substrate 201. A trench 211 is then formed in the semiconductor substrate 201 using the stacked film pattern as a mask.

Referring now to FIG. 14(b), a buried oxide film 233 is then buried in the trench. Then, the nitride film 205 is removed and a second floating gate electrode 213 made of polysilicon is formed.

Referring now to FIG. 14(c), a capacitor film 214 and a control gate electrode 215 is formed. Control gate electrode 215 is made of polysilicon.

However, the conventional manufacturing method of a flash memory of this type can have problems. First, the reliability of the tunnel oxide film can be low. Second, the process can become complicated when forming the floating gate electrodes in a two-layered structure in order to implement a high capacitance ratio.

Adverse effects may result from the above-mentioned problems as will now be explained.

First, when a shallow trench isolation (STI) is formed with a self-aligned technology with respect to the floating gate electrode 203 of the first layer, a distance between a substrate edge (a trench shoulder portion) of the STI and a floating gate of the first layer can be short. This can create current leakage in a shoulder portion (A illustrated in FIG. 14(c)) of trench 211 during the operation time. Thus, holding characteristics can be deteriorated resulting in a reduced reliability in the tunnel oxide film.

Second, a width of the floating gate electrode 203 of the first layer is equal to a channel width. Thus, a capacitance ratio cannot be increased unless a surface area of a floating gate electrode opposite to the control gate electrode 215 is increased by forming the floating gate electrode 213 of the second layer to a width longer than the width of the floating gate electrode 203 of the first layer. Doing so, may increase the area consumed by each memory cell.

In view of the above discussion, it would be desirable to provide a semiconductor device such as a flash memory and its manufacturing method that may have a single-layer floating gate electrode structure without an influence of an electric field concentration in a trench shoulder portion during operation.

SUMMARY OF THE INVENTION

According to the present embodiments, a semiconductor device includes memory cells isolated by a trench that may be self aligned with a stacked film pattern. The memory cells may be flash memory cells having an active gate film that may be thinner than a gate oxide film. The active gate film may be located in a central portion under of a gate electrode. The gate oxide film may be located under end portions of the gate electrode. In this way, a distance between a shoulder portion of a trench and a gate electrode may be increased. Thus, an electric field concentration in the shoulder portion of the trench may be decreased and memory cell characteristics may be improved.

According to one aspect of the embodiments, a semiconductor device may include a semiconductor substrate in which an isolation film may be buried. A gate insulating film may be formed between the isolation film and may have end portions adjacent to the isolation film that may be thicker than a central portion.

According to another aspect of the embodiments, the semiconductor device may include a trench in the semiconductor substrate between adjacent gate insulating films. The trench may have a width essentially the same as the distance between the adjacent insulating films. The isolation film may be buried in the trench.

According to another aspect of the embodiments, a first electrode may be formed on the gate insulating film. A capacitance insulating film may be formed on the first electrode. A second electrode may be formed on the capacitance insulating film.

According to another aspect of the embodiments, an upper surface of the isolation film may be at substantially the same height as an upper surface of the end portion of the gate insulating film.

According to another aspect of the embodiments, an upper surface of the isolation film may be higher than an upper surface of the end portion of the gate insulating film.

According to another aspect of the embodiments, a first electrode may be formed on the gate insulating film. The first electrode may have a recessed portion at a central first electrode portion between the isolation film.

According to another aspect of the embodiments, the semiconductor device may be a flash memory.

According to another aspect of the embodiments, a manufacturing method of a semiconductor device may include the steps of forming a first oxide film on a surface of a semiconductor substrate, depositing a stacked film including a first conductive layer in contact with the first oxide film, etching the stacked film and the first oxide film to form a plurality of stacked film patterns arranged on the semiconductor substrate, oxidizing the semiconductor substrate to form a second oxide film on a surface of the semiconductor substrate sandwiched between adjacent stacked film patterns and a surface of the semiconductor substrate below end portions of the stacked film patterns wherein the second oxide film has a film thickness thicker than the first oxide film, forming a side wall mask film on a side of the stacked film patterns to form mask patterns including the stacked film patterns, removing the portion of the second oxide film sandwiched between the mask patterns and a portion of the underlying semiconductor substrate using the mask patterns as a mask to form a trench in the semiconductor substrate, and filling the trench with an insulating film.

According to another aspect of the embodiments, the step of filling the trench with an insulating film may include forming the insulating film to have a top surface having a height that essentially matches with a height of the second oxide film.

According to another aspect of the embodiments, the method of manufacturing the semiconductor device may include the steps of forming a capacitance insulating film on the surface including the first conductor layer after the step of filling the trench with an insulating film and forming an electrode of the capacitance insulating film.

According to another aspect of the embodiments, the side wall mask film may include a nitride film.

According to another aspect of the embodiments, the second oxide film may be approximately 20 to 50 nm thicker than the first oxide film.

According to another aspect of the embodiments, the stacked film includes a stopper film that may provide a stopper for a chemical mechanical polishing step.

According to another aspect of the embodiments, a manufacturing method of a semiconductor device may include the steps of forming a first oxide film on a surface of a semiconductor substrate, depositing a stacked film including a first stopper layer in contact with the first oxide film, etching the stacked film and the first oxide film to form a plurality of stacked film patterns arranged on the semiconductor substrate, oxidizing the semiconductor substrate to form a second oxide film on a surface of the semiconductor substrate sandwiched between adjacent stacked film patterns and a surface of the semiconductor substrate below end portions of the stacked film patterns wherein the second oxide film has a film thickness thicker than the first oxide film, removing the portion of the second oxide film sandwiched between the mask patterns and a portion of the underlying semiconductor substrate using the mask patterns as a mask to form a trench in the semiconductor substrate, and filling the trench with an insulating film.

According to another aspect of the embodiments, the step of filling the trench with an insulating film may include forming the insulating film to have a top surface having a height that essentially matches with a height of the first stopper layer.

According to another aspect of the embodiments, the manufacturing method may further include the steps of removing the stacked film patterns so that at least the second oxide film below the stacked film patterns may remain, forming a gate oxide film in a region between the second oxide film, and forming a first electrode over the gate oxide film and at least a portion of the second oxide film.

According to another aspect of the embodiments, the first electrode may include end portions next to the insulating film that may be higher than a central portion of the first electrode.

According to another aspect of the embodiments, the insulating film may have a top surface that substantially matches with a top surface of the first electrode.

According to another aspect of the embodiments, the manufacturing method may further include the steps of forming a capacitance insulating film on the first electrode and forming a second electrode on the capacitance insulating film.

According to another aspect of the embodiments, the first electrode may include polysilicon.

DETAILED DESCRIPTION OF THE EMBODIMENTS

Various embodiments of the present invention will now be described in detail with reference to a number of drawings.

Figure 1:
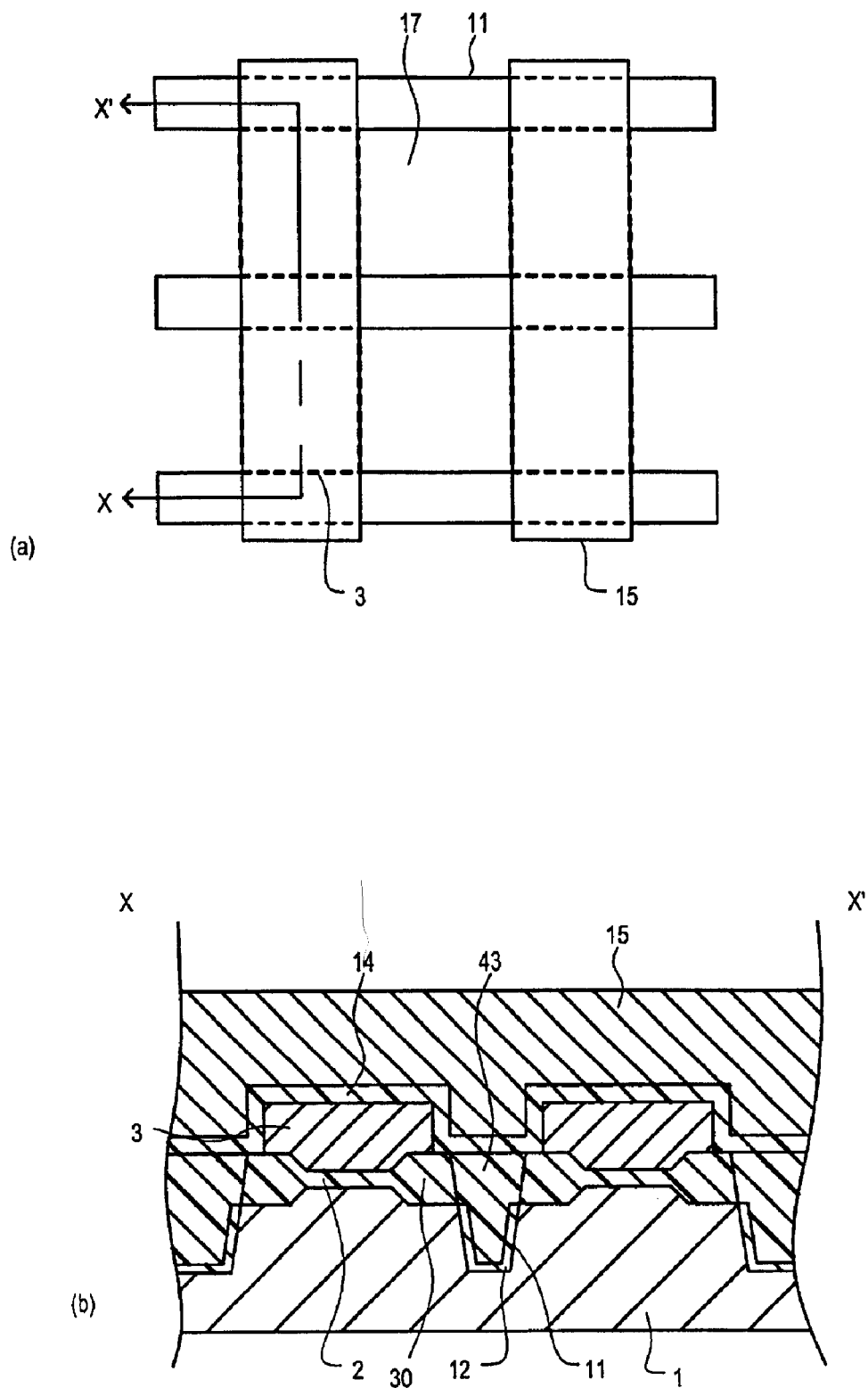
FIG. 1(a) is a plan view illustrating regions including a diffusion layer and shallow trench isolation (STI) of a semiconductor device in accordance with the first embodiment.
FIG. 1(b) is a cross-sectional view of the semiconductor device after various processing steps in accordance with the first embodiment.
Figure 2:
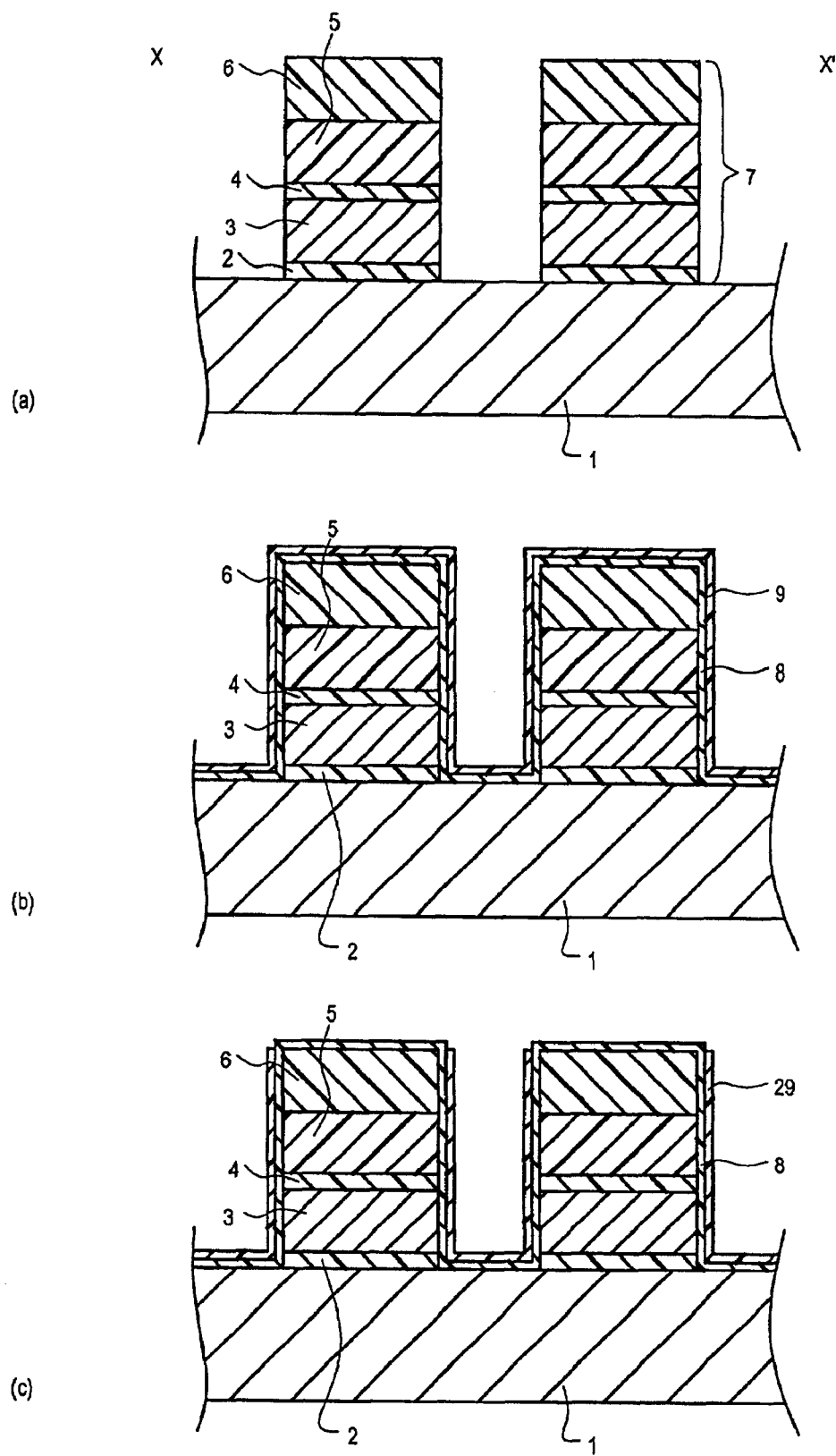
FIGS. 2(a)–(c) are cross-sectional views of the semiconductor device after various processing steps in accordance with the first embodiment.
Figure 3:
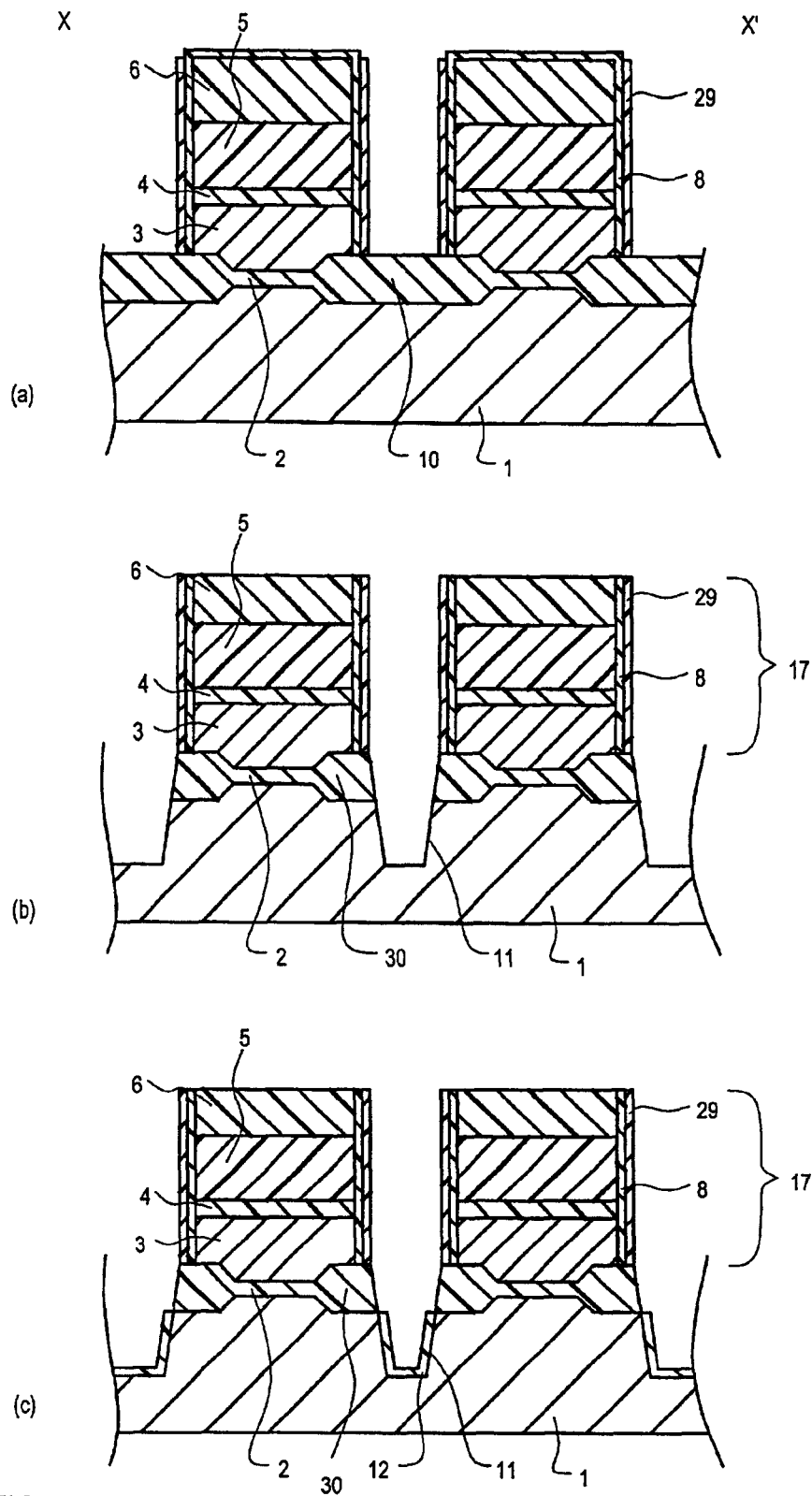
FIGS. 3(a)–(c) are cross-sectional views of the semiconductor device after various processing steps in accordance with the first embodiment.
Figure 4:
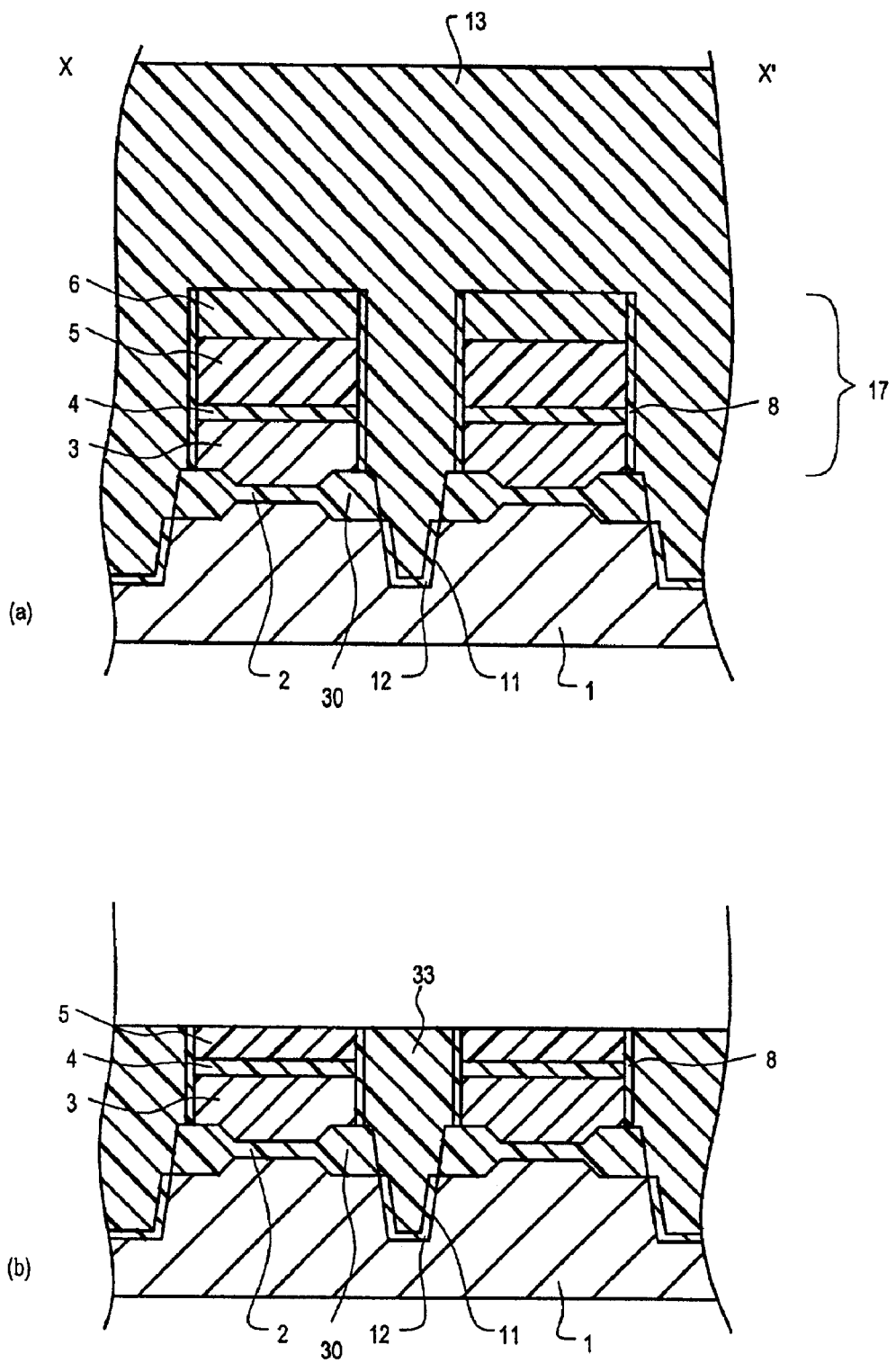
FIGS. 4(a)–(b) are cross-sectional views of the semiconductor device after various processing steps in accordance with the first embodiment.
Figure 5:
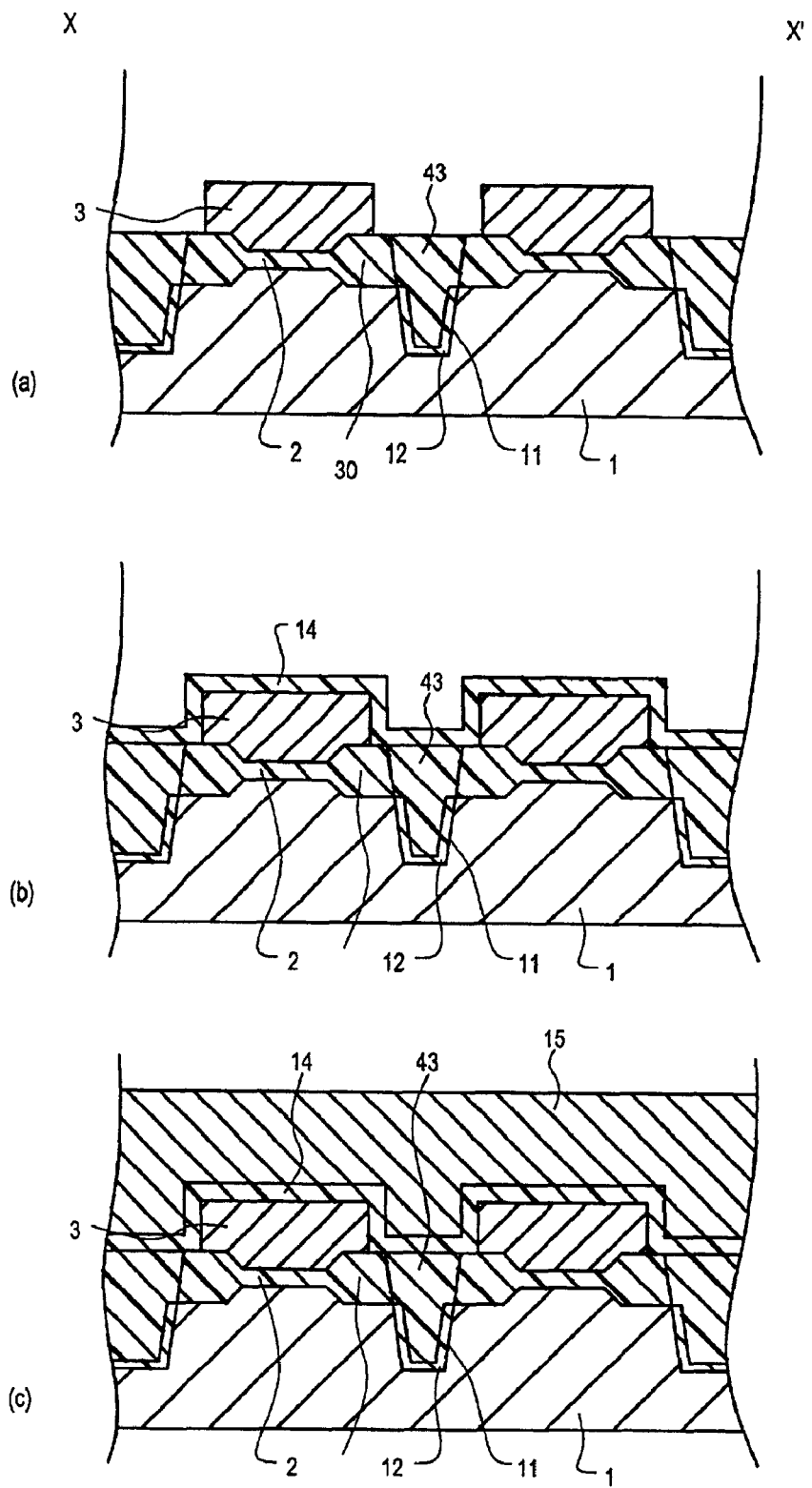
FIGS. 5(a)–(c) are cross-sectional views of the semiconductor device after various processing steps in accordance with the first embodiment.

A first embodiment of the present invention will now be described with reference to FIG. 1. FIG. 1(a) is a plan view illustrating regions including a diffusion layer and shallow trench isolation (STI) of a semiconductor device in accordance with the first embodiment. The plan view of FIG. 1(a) may be of a group of flash memory cells. FIG. 1(b) is a cross-sectional view of the semiconductor device after various processing steps in accordance with the first embodiment. FIG. 1(b) may be a cross-sectional view taken along line X—X' as illustrated in FIG. 1(a).

As illustrated in FIGS. 1(a) and 1(b), a flash memory cell structure on a semiconductor substrate 1 may include a tunnel oxide film 2 in the vicinity of a center directly below a floating gate electrode 3. A gate oxide film 30 may be in the vicinity of the edge of the floating gate electrode 3. Gate oxide film 30 may have a thickness that is greater than the thickness of tunnel oxide film 2. The flash memory cell structure may include a shallow trench isolation (STI) structure for isolation, which may be illustrated as trench 11. A diffusion region 17 may form a source/drain connection between memory cells.

A manufacturing method for forming the flash memory cell structure illustrated in FIG. 1 will now be described with reference to FIGS. 2 to 5. FIGS. 2 to 5 are cross-sectional views of the semiconductor device after various processing steps in accordance with the first embodiment. FIGS. 2 to 5 may be cross-sectional views taken along line X—X' as illustrated in FIG. 1(a).

Referring now to FIG. 2(a), a tunnel oxide film having a thickness of approximately 7 nm to 11 nm, polysilicon having a film thickness of approximately 50 to 150 nm, an intermediate oxide film having a film thickness of approximately 10 to 20 nm, a nitride film having a film thickness of approximately 50 to 200 nm, and an upper layer oxide film having a film thickness of approximately 20 to 100 nm may be sequentially deposited on a surface of semiconductor substrate 1. Subsequently, a stacked film 7 including tunnel oxide film 2, floating gate electrode 3, intermediate oxide film 4, nitride film 5, and upper layer oxide film 6 may be formed through a pattern and etch step. Stacked film 7 may be formed on a region which may become a channel region of a memory cell including a transistor. In this case, a plurality of stacked film patterns such as stacked film 7 may be arranged on the semiconductor substrate at predetermined intervals as illustrated in FIG. 2(a).

Referring now to FIG. 2(b), an oxide film 8 and a nitride film 9 may be sequentially formed on a surface of stacked film 7. Oxide film 8 may be formed by thermal oxidation and may have a thickness of approximately 10 nm. Nitride film 9 may have a thickness of approximately 10 to 100 nm.

Referring now to FIG. 2(c), nitride film 9 may be etched back and a nitride spacer 29 may be formed on a side wall of stacked film 7.

Referring now to FIG. 3(a), a bird's beak may be formed in the semiconductor substrate below the end of the floating gate electrode 3. The bird's beak may be formed by a thermal oxidation step. For example, the bird's beak may include an oxide film 10 having a film thickness that can be approximately 20 to 50 nm thicker in a region between the stacked film 7 patterns than that of the tunnel oxide film 2 that is formed in the center of the floating gate electrode 3.

Referring now to FIG. 3(b), the oxide film 10 between the arranged stack film 7 patterns may be removed by etching using the stacked film 7 patterns having the nitride film spacer 29 on the outside as a mask. In this way, a part of the oxide film 10 may be removed so that the gate oxide film 30 may remain below the ends of the floating gate electrode 3. In this case, a part of the upper layer oxide film 6 at the top of stacked film 7 may be etched so that its height may be reduced to become stacked film 17. Also, a film thickness of the oxide film at the top of stacked film 7 may be set so that upper oxide film 6 at the top of stacked film 17 may not be eliminated.

Subsequently, silicon etching may be performed using upper layer oxide film 6 and nitride film spacer 29 of stacked film 17 as a mask. In this way, a trench 11 (STI) having a depth of approximately 0.2 to 0.3 μm may be formed in the semiconductor substrate 1 between the arranged stack film 17 patterns as illustrated in FIG. 3(b).

Referring now to FIG. 3(c), rounding oxidation for smoothing a corner of trench 11 may be performed so that an oxide film 12 may be formed on a surface of the trench 11.

Referring now to FIG. 4(a), nitride film spacer 29 may be removed by etching. Then, an oxide film 13 may be formed so that an area between the stacked film 17 patterns including the trench 11 may be entirely buried.

Referring now to FIG. 4(b), the entire substrate surface including the oxide film 13 may be planarized by using a chemical mechanical polishing (CMP) method, for example. In this way, oxide film 13 may be modified to become a buried oxide film 33. In this case, nitride film 5 of stacked film 17 may become a stopper for the planarization using CMP and a surface of the buried oxide film 33 may become substantially the same height as a stopper surface of the nitride film 5. In this case, nitride film 5 acting as the stopper may have a film thickness reduced by the CMP method and may function as a stopper over a range including its entire film thickness from when the nitride film 5 is exposed to a stage in which the nitride film 5 may be eliminated.

Referring now to FIG. 5(a), subsequently the residual film including intermediate oxide film 4 and nitride film 5 above the floating gate electrode 3 of the stacked film 17 may be removed with etching, during this time, a portion of the buried oxide film 33 may be etched to form buried oxide film 43. In this case, an etching condition may be set so that a surface of the buried oxide film 43 may substantially match with a surface of the gate oxide film 30.

Referring now to FIG. 5(b), a capacitor film 14 may be formed on the surface including floating gate electrode 3. Capacitor film 14 may include a stacked structure of an oxide film/nitride film/oxide film (ONO film) and may have a film thickness of approximately 5 nm.

Referring now to FIG. 5(c), a control gate electrode 15 may be formed and may have a film thickness of about 0.2 μm. In this way, a flash memory cell structure of the first embodiment may be obtained as illustrated in FIG. 5(c).

By applying a structure of the first embodiment of the present invention and its manufacturing method, a flash memory cell structure having a STI structure that is self-aligned with a floating gate may be formed. In this way, highly integrated memory cells may be formed while maintaining highly reliable flash memory cells and a reduction in writing and erase voltage may be achieved by implementing a high capacitance ratio.

By forming the gate oxide film that is thicker below the vicinity of the edges of the gate electrode than the tunnel oxide film in the vicinity of the center of the gate electrode, the channel region may include a capacitance (substrate capacitance) between the floating gate electrode and the semiconductor substrate that may be smaller than the capacitance (control capacitance) between the floating gate electrode and the control gate. Thus, a capacitance ratio of the control capacitance compared to the substrate capacitance can be made high.

Because the gate oxide film may be thicker below a region of the edges of the floating gate electrode, a distance between the floating gate electrode and the edge of the STI may be increased. This may eliminate the reliability reduction caused by a high electric field concentration at the edge of the STI.

Figure 6:
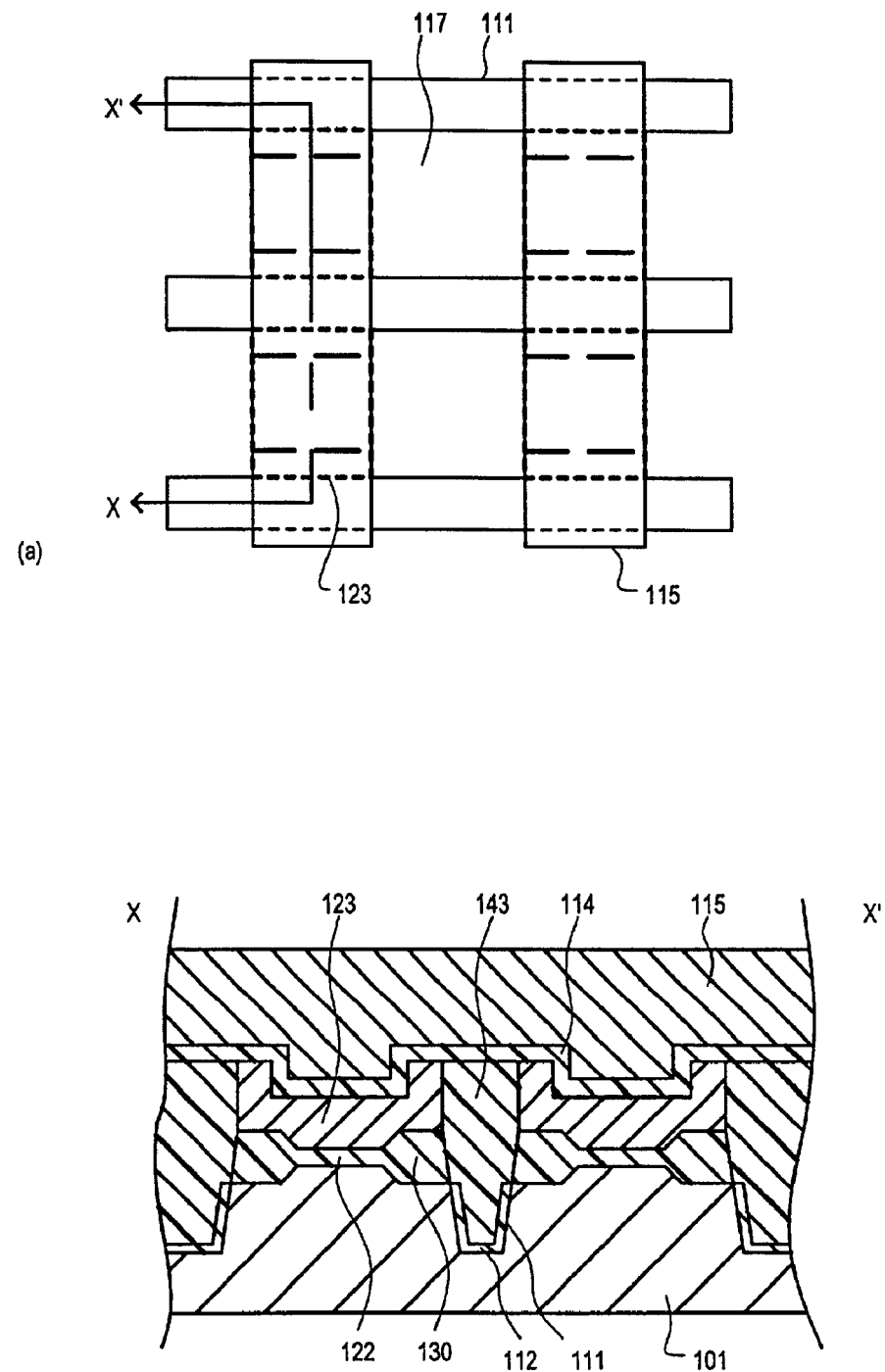
FIG. 6(a) is a plan view illustrating regions including a diffusion layer and shallow trench isolation (STI) of a semiconductor device in accordance with the second embodiment.
FIG. 6(b) is a cross-sectional view of the semiconductor device after various processing steps in accordance with the second embodiment.
Figure 7:
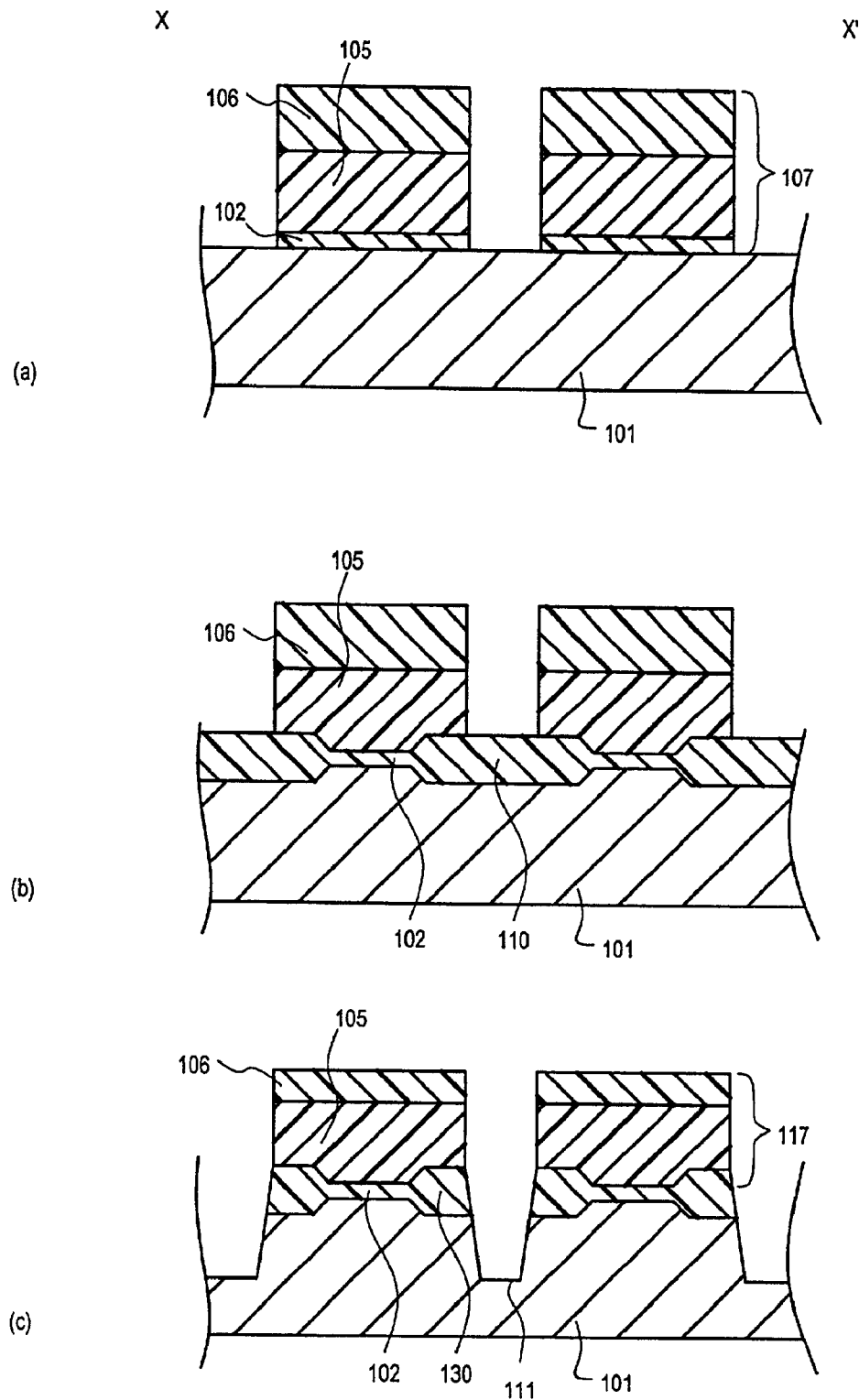
FIGS. 7(a)–(c) are cross-sectional views of the semiconductor device after various processing steps in accordance with the second embodiment.
Figure 8:
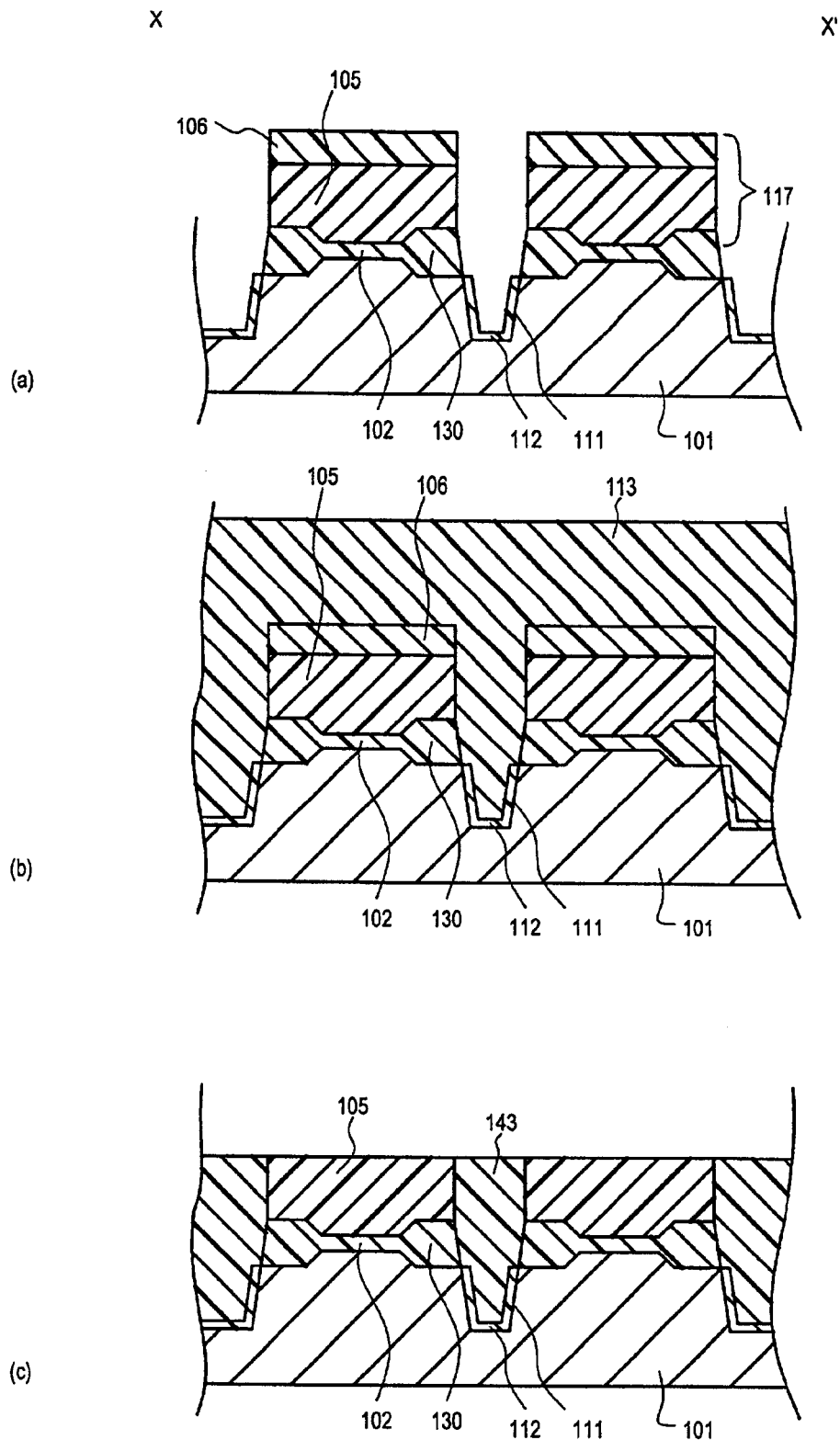
FIGS. 8(a)–(c) are cross-sectional views of the semiconductor device after various processing steps in accordance with the second embodiment.
Figure 9:
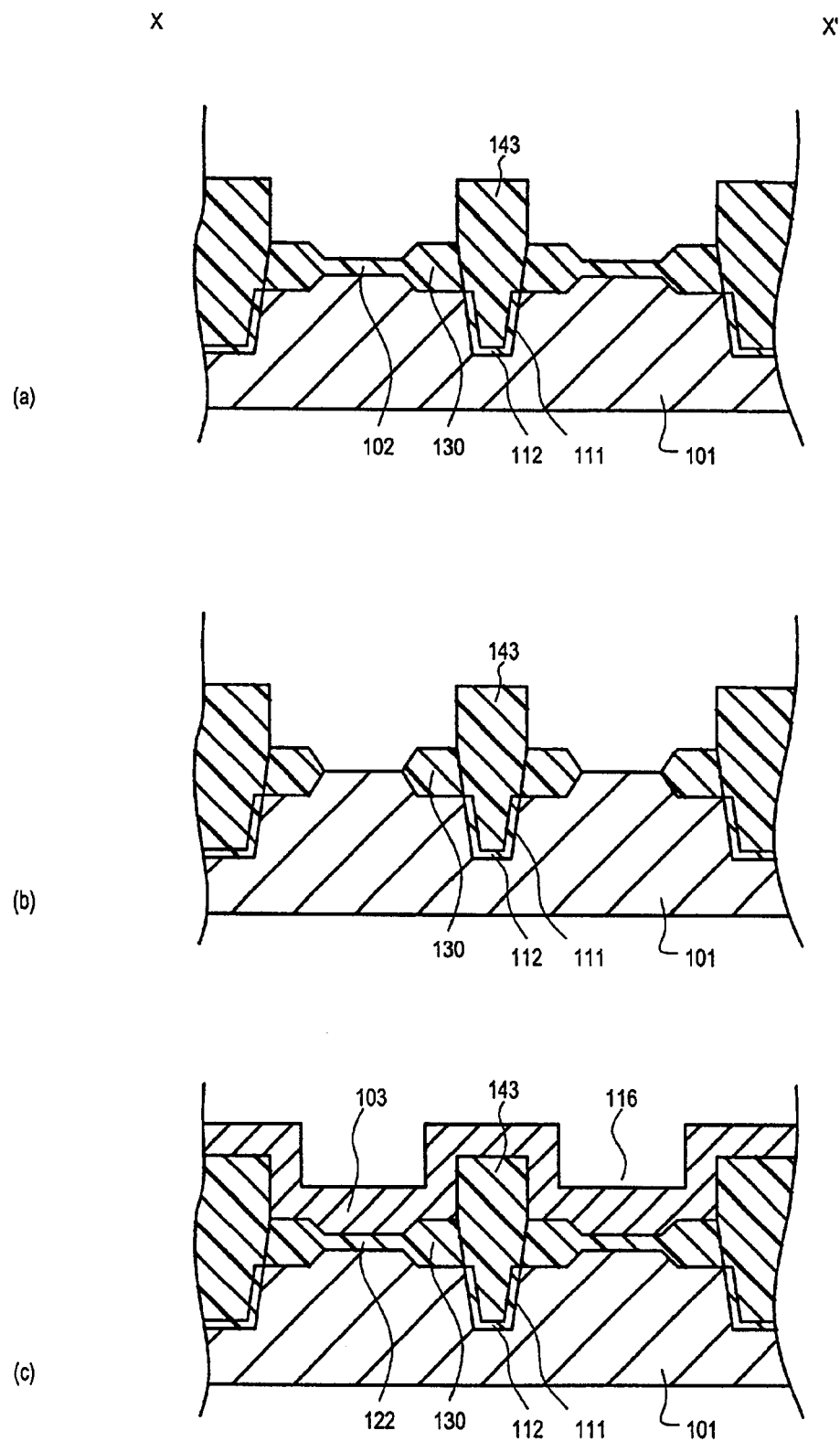
FIGS. 9(a)–(c) are cross-sectional views of the semiconductor device after various processing steps in accordance with the second embodiment.
Figure 10:
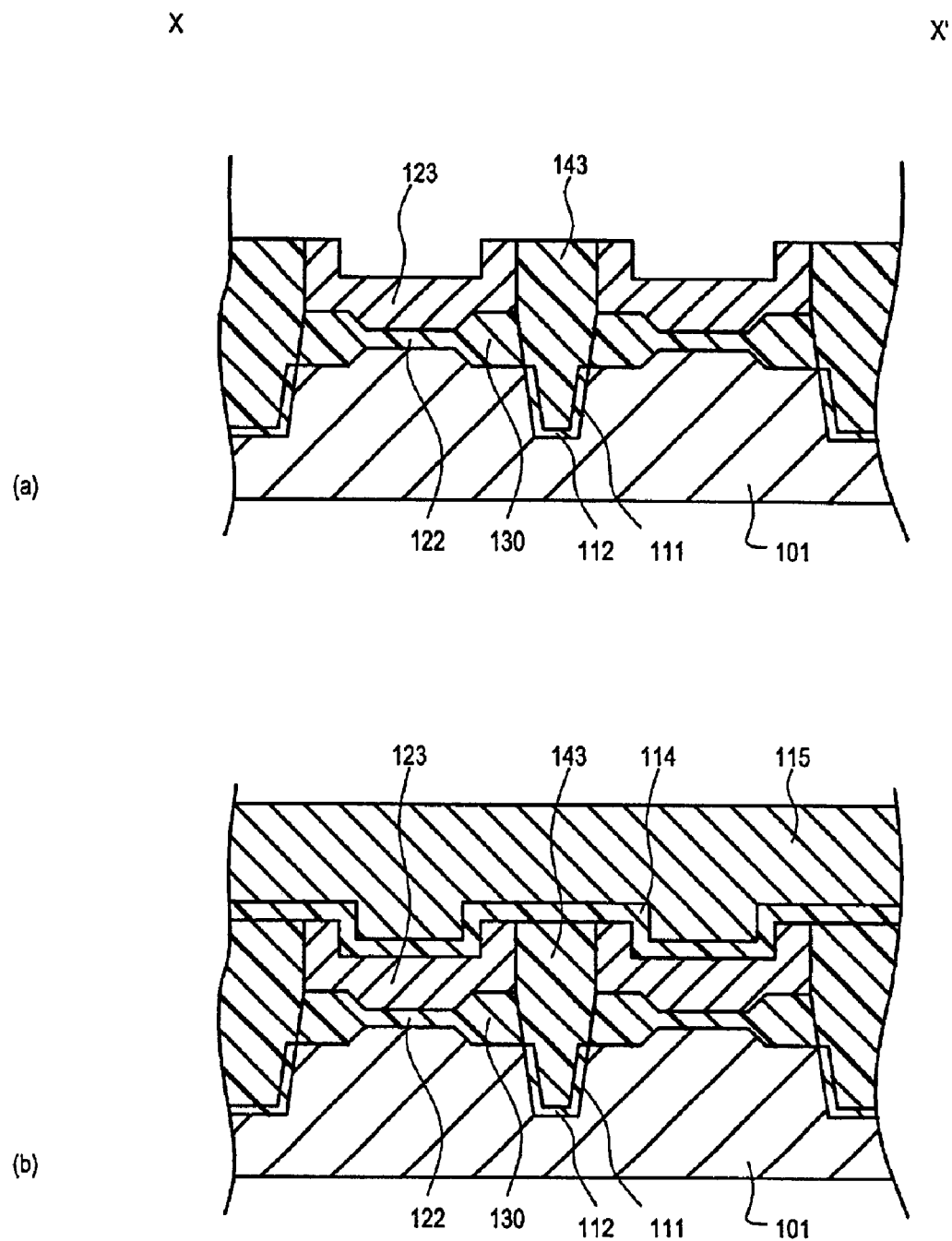
FIGS. 10(a)–(b) are cross-sectional views of the semiconductor device after various processing steps in accordance with the second embodiment.

A second embodiment of the present invention will now be described with reference to FIGS. 6 to 10. FIG. 6(a) is a plan view illustrating regions including a diffusion layer and shallow trench isolation (STI) of a semiconductor device in accordance with the second embodiment. The plan view of FIG. 6(a) may be of a group of flash memory cells. FIG. 6(b) is a cross-sectional view of the semiconductor device after various processing steps in accordance with the second embodiment. FIG. 6(b) may be a cross-sectional view taken along line X—X' as illustrated in FIG. 6(a).

The present embodiment may include a feature in that a capacitance ratio of a control capacitance compared to a substrate capacitance may be higher than that of the first embodiment. This may be accomplished by forming a floating gate electrode having a recess shape. Otherwise, the basic structure may be similar to that of the first embodiment.

As illustrated in FIGS. 6(a) and 6(b), a flash memory cell structure on a semiconductor substrate 101 may include a tunnel oxide film 122 in the vicinity of a center directly below a floating gate electrode 123. A gate oxide film 130 may be in the vicinity of the edge of the floating gate electrode 123. Gate oxide film 130 may have a thickness that is greater than the thickness of tunnel oxide film 122. The flash memory cell structure may include a shallow trench isolation (STI) structure for isolation, which may be illustrated as trench 111. A diffusion region 117 may form a source/drain connection between memory cells.

A manufacturing method for forming the flash memory cell structure illustrated in FIG. 6 will now be described with reference to FIGS. 7 to 10. FIGS. 7 to 10 are cross-sectional views of the semiconductor device after various processing steps in accordance with the second embodiment. FIGS. 7 to 10 may be cross-sectional views taken along line X—X' as illustrated in FIG. 6(a).

Referring now to FIG. 7(a), an underlay oxide film having a thickness of approximately 10 nm to 20 nm, a nitride film having a film thickness of approximately 50 to 250 nm, and an upper layer oxide film having a film thickness of approximately 20 to 100 nm may be sequentially deposited on a surface of semiconductor substrate 1. Subsequently, a stacked film 107 including underlay oxide film 102, nitride film 105, and upper layer oxide film 106 may be formed through a pattern and etch step. Stacked film 107 may be formed on a region which may become a channel region of a memory cell including a transistor. In this case, a plurality of stacked film patterns such as stacked film 107 may be arranged on the semiconductor substrate at predetermined intervals as illustrated in FIG. 7(a).

Referring now to FIG. 7(b), a bird's beak may be formed in the semiconductor substrate below the end of the nitride film 105. The bird's beak may be formed by a thermal oxidation step. For example, the bird's beak may include an oxide film 110 having a film thickness that can be thicker in a region between the stacked film 107 patterns than that of the underlay oxide film 102 that is formed in the center of the nitride film 105.

Referring now to FIG. 7(c), the oxide film 110 between the arranged stack film 107 patterns may be removed by etching using the stacked film 107 patterns as a mask. In this way, a part of the oxide film 110 may be removed so that the gate oxide film 130 may remain below the ends of the nitride film 105. In this case, a part of the upper layer oxide film 106 at the top of stacked film 107 may be etched so that its height may be reduced to become stacked film 117. Also, a film thickness of the oxide film at the top of stacked film 107 may be set so that upper oxide film 106 at the top of stacked film 117 may not be eliminated.

Subsequently, silicon etching may be performed using upper layer oxide film 106 and nitride film 105 of stacked film 117 as a mask. In this way, a trench 111 (STI) may be formed in the semiconductor substrate 101 between the arranged stack film 117 patterns as illustrated in FIG. 7(c).

Referring now to FIG. 8(a), rounding oxidation for smoothing a corner of trench 111 may be performed so that an oxide film 112 may be formed on a surface of the trench 111.

Referring now to FIG. 8(b), an oxide film 113 may then be formed so that an area between the stacked film 117 patterns including the trench 111 may be entirely buried.

Referring now to FIG. 8(c), the entire substrate surface including the oxide film 113 may be planarized by using a chemical mechanical polishing (CMP) method, for example. In this way, oxide film 113 may be modified to become a buried oxide film 143. In this case, nitride film 105 of stacked film 117 may become a stopper for the planarization using CMP and a surface of the buried oxide film 143 may become substantially the same height as a stopper surface of the nitride film 105.

Referring now to FIG. 9(a), subsequently the nitride film 105 may be removed with etching, so that the buried oxide film 143 may protrude from the surface of the semiconductor substrate 101.

Referring now to FIG. 9(b), the underlay oxide film 102 may be removed.

Referring now to FIG. 9(c), the exposed semiconductor substrate may be subjected to a thermal oxidation step to form a tunnel oxide film 122. Then, polysilicon 103 may be deposited having a film thickness that may be thinner than one-half of a distance between adjacent buried oxide films 143 (approximately corresponding to a width of stacked film 117 in FIG. 7(c)). Polysilicon 103 may be used as a floating gate electrode material. Because the buried oxide film 143 protrudes from the surface of the semiconductor substrate 101, polysilicon 103 may include a recessed portion 116 between the buried oxide films 143 as illustrated in FIG. 9(c).

Referring now to FIG. 10(a), the recessed portion 116 may be selectively buried in a resist. The polysilicon 103 on the buried oxide film 143 may then be selectively removed to form a floating gate electrode 123.

Referring now to FIG. 10(b), a capacitor film 114 may be formed on the surface including floating gate electrode 123. Capacitor film 114 may include a stacked structure of an oxide film/nitride film/oxide film (ONO film). Next, a control gate electrode 115 may be formed. In this way, a flash memory cell structure of the second embodiment may be obtained as illustrated in FIG. 10(b).

In the second embodiment, the capacitance ratio may be higher than in the first embodiment. Thus, by applying a structure of the second embodiment of the present invention and its manufacturing method, a flash memory cell structure having a reduction in writing and erase voltage may be achieved by implementing a high capacitance ratio.

The stacked film 17 of the first embodiment may be made of a multi-layer film and a spacer film (such as nitride spacer film 29) may be used on the side-wall. This may complicate the process to form the trench 11. However, the present embodiment may include advantages in that the manufacturing process to form the trench 111 may be less complicated because the number of layers of the stacked film 117 may be reduced as compared to the first embodiment and a spacer film on the side-wall may not be needed.

Figure 11:
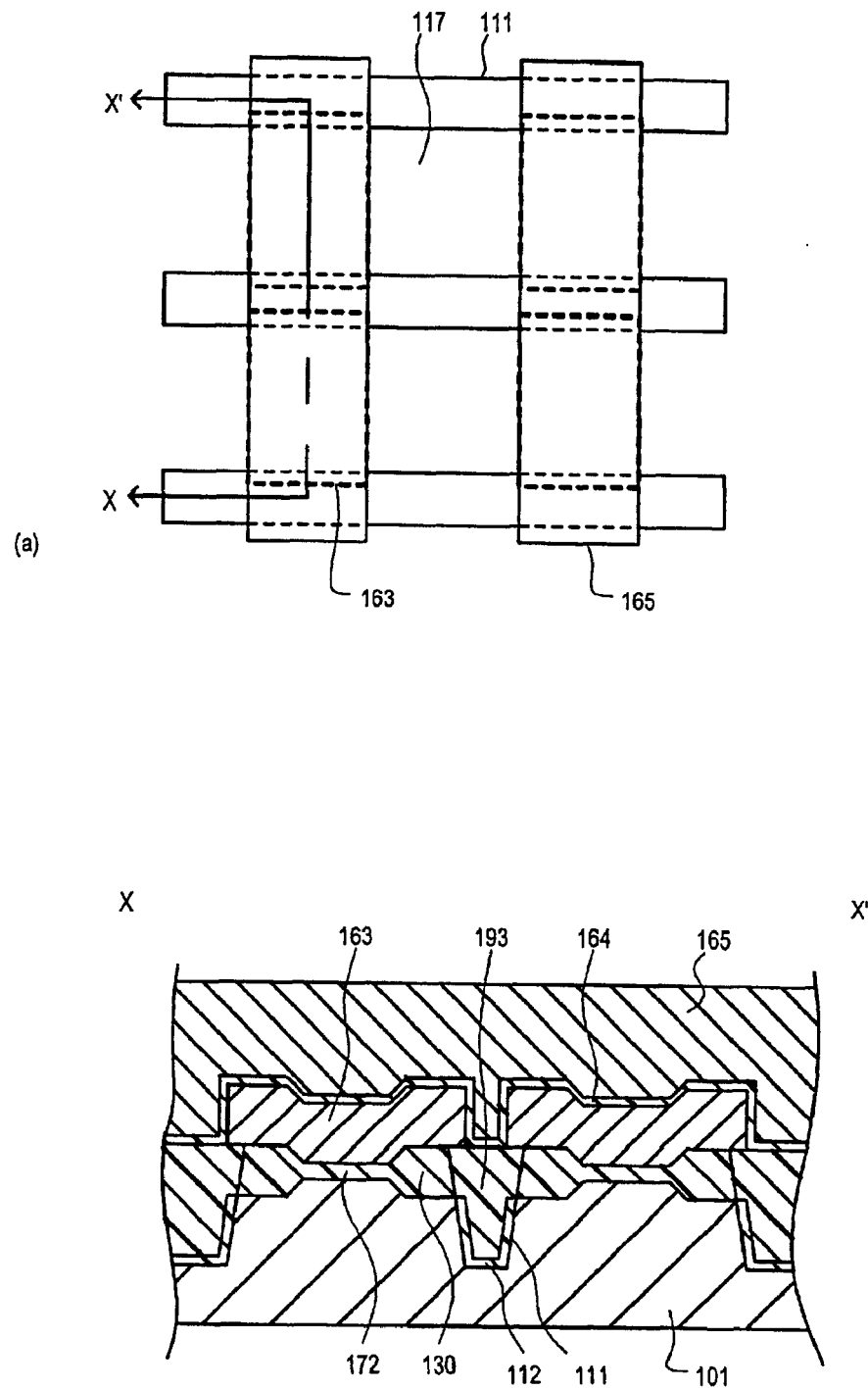
FIG. 11(a) is a plan view illustrating regions including a diffusion layer and shallow trench isolation (STI) of a semiconductor device in accordance with the third embodiment.
FIG. 11(b) is a cross-sectional view of the semiconductor device after various processing steps in accordance with the third embodiment.
Figure 12:
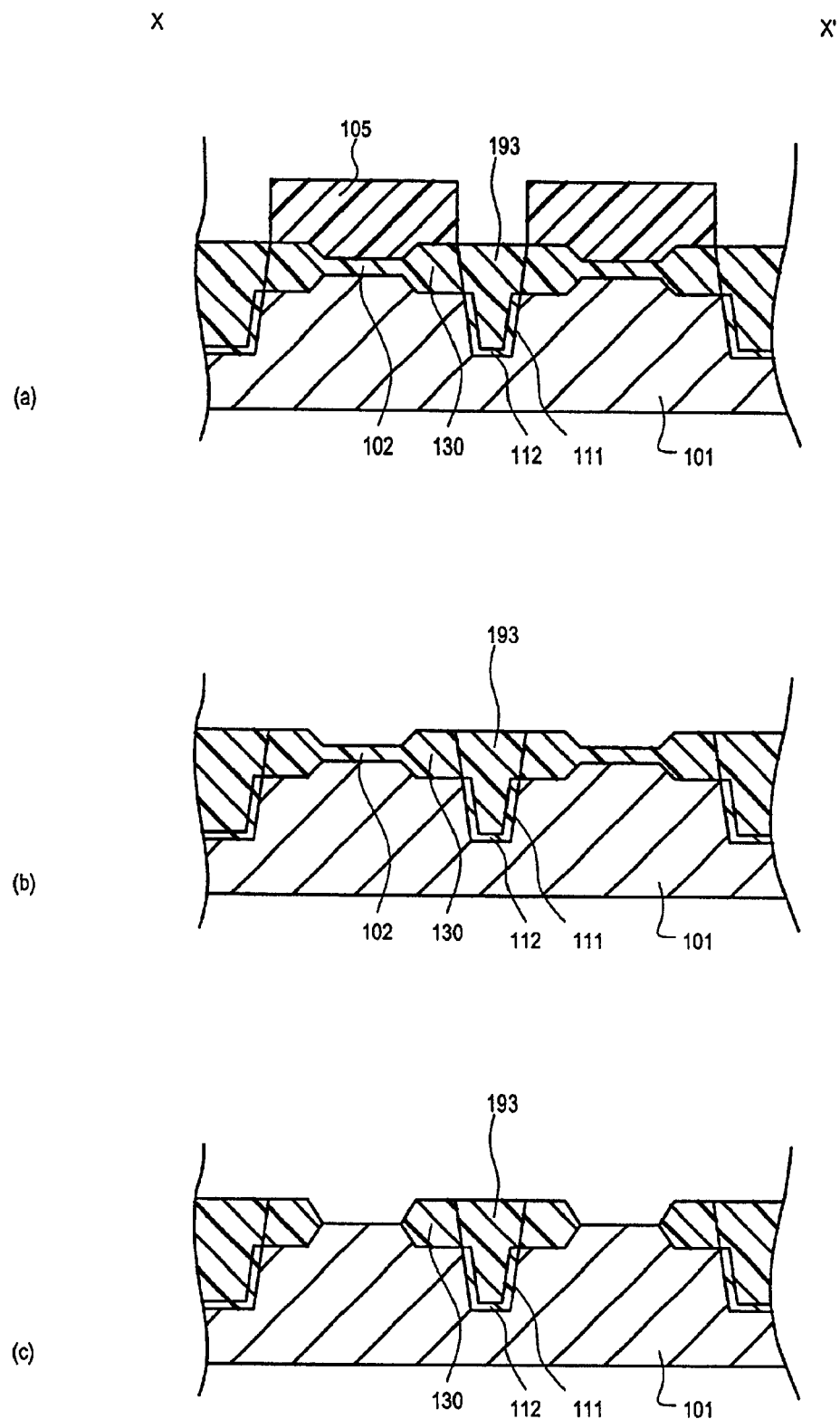
FIGS. 12(a)–(c) are cross-sectional views of the semiconductor device after various processing steps in accordance with the third embodiment.
Figure 13:
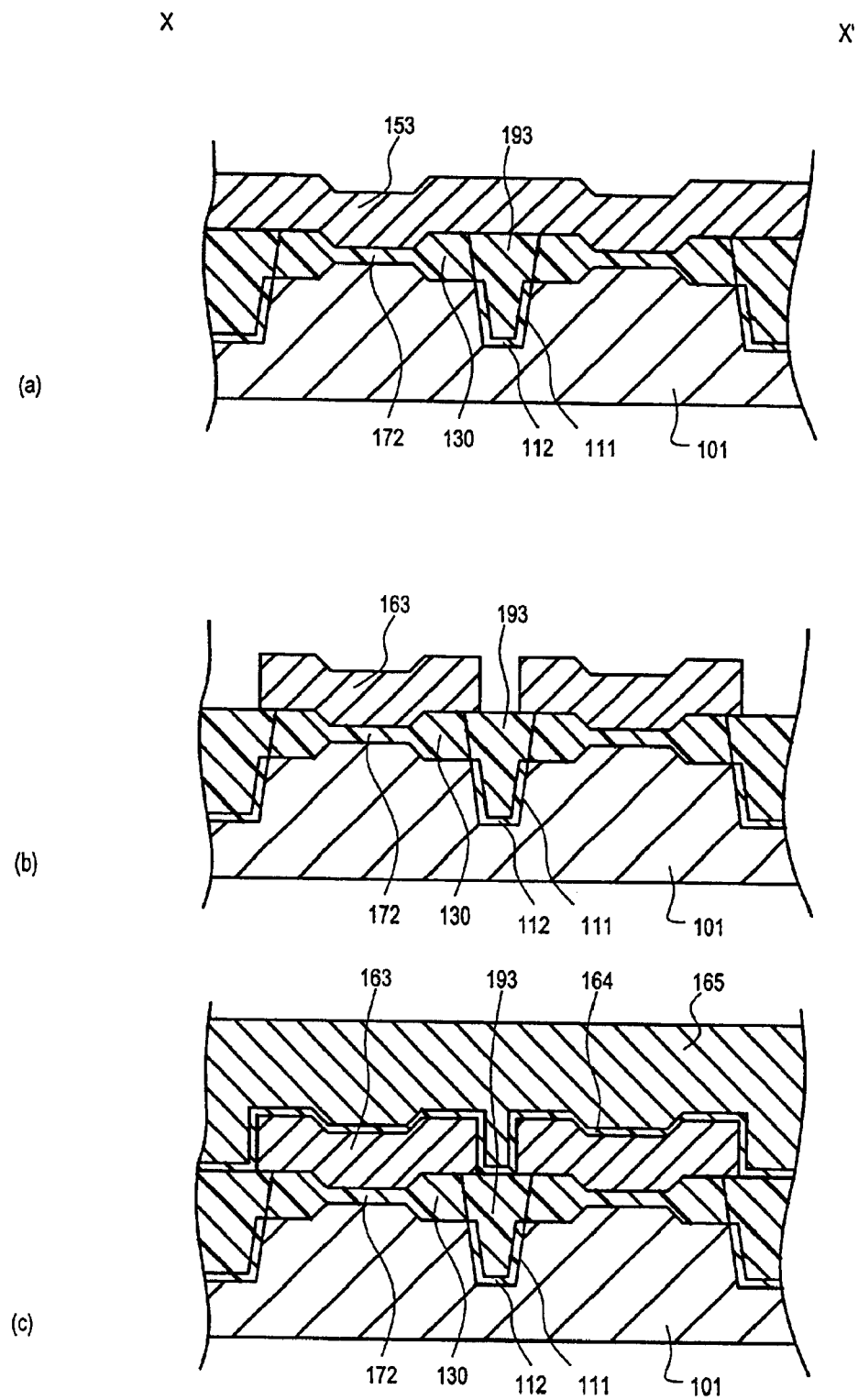
FIGS. 13(a)–(c) are cross-sectional views of the semiconductor device after various processing steps in accordance with the third embodiment.
Figure 14:
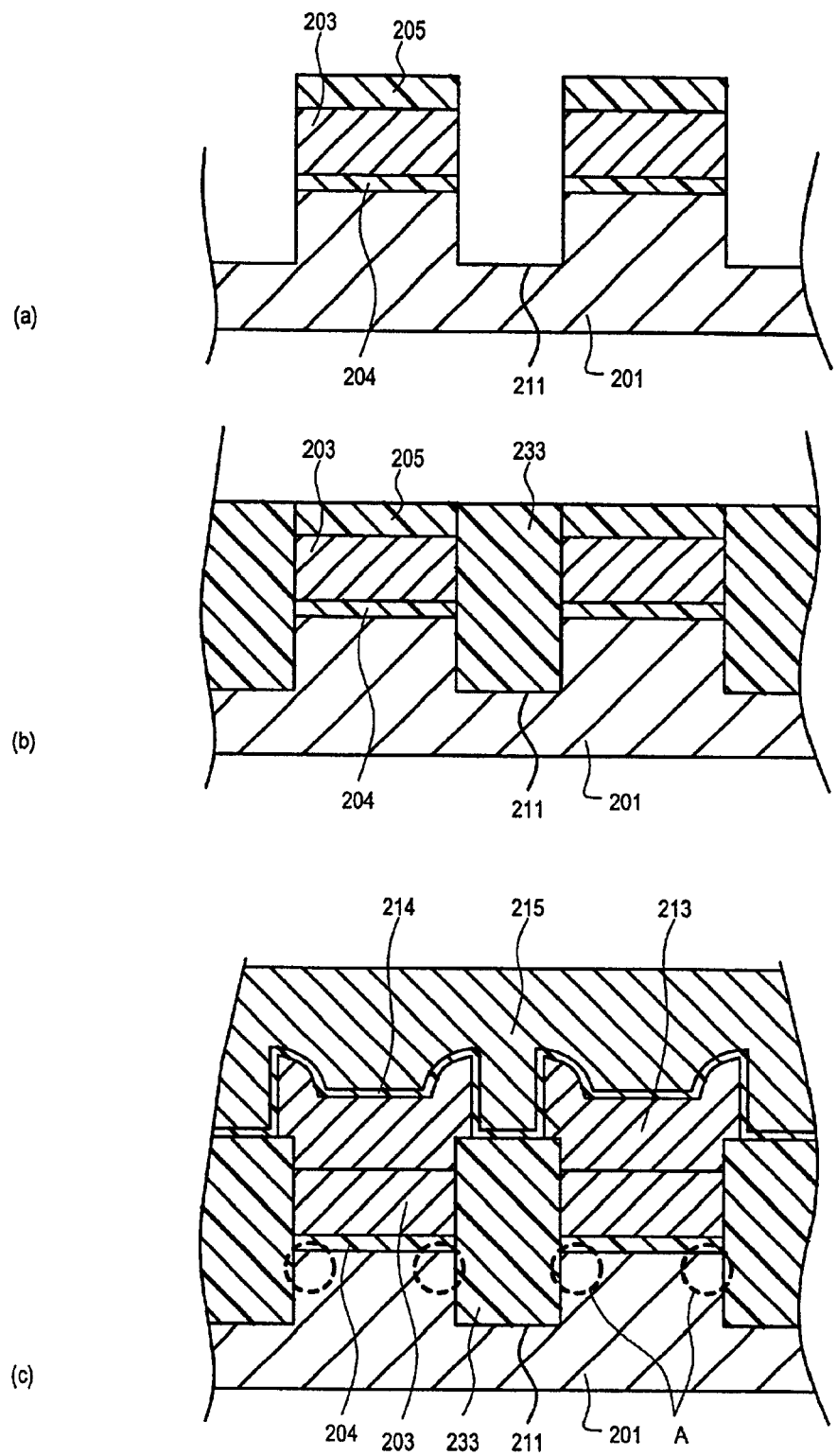
FIGS. 14(a)–(c) are cross-sectional views of a conventional semiconductor device after various processing steps.

A third embodiment of the present invention will now be described with reference to FIGS. 11 to 15. FIG. 11(a) is a plan view illustrating regions including a diffusion layer and shallow trench isolation (STD of a semiconductor device in accordance with the third embodiment. The plan view of FIG. 11(a) may be of a group of flash memory cells. FIG. 11(b) is a cross-sectional view of the semiconductor device after various processing steps in accordance with the third embodiment. FIG. 11(b) may be a cross-sectional view taken along line X—X' as illustrated in FIG. 11(a).

The present embodiment may include a feature in that the manufacturing process may be further simplified in comparison to the first and second embodiments while maintaining the basic structure of the first embodiment. Because the manufacturing method of the present embodiment may be identical to the manufacturing method up to the flash memory cell structure as illustrated in FIG. 8(c) of the second embodiment, only later steps may be described.

As illustrated in FIGS. 11(a) and 11(b), a flash memory cell structure on a semiconductor substrate 101 may include a tunnel oxide film 172 in the vicinity of a center directly below a floating gate electrode 163. A gate oxide film 130 may be in the vicinity of the edge of the floating gate electrode 163. Gate oxide film 130 may have a thickness that is greater than the thickness of tunnel oxide film 172. The flash memory cell structure may include a shallow trench isolation (STI) structure for isolation, which may be illustrated as trench 111. A diffusion region 117 may form a source/drain connection between memory cells.

Referring once again to FIG. 8(c), a portion of a nitride film 105 of a stacked film 117 may be left after a CMP step and nitride film 105 may have a surface that may substantially match a surface of the buried oxide film 143.

Referring now to FIG. 12(a), a portion of the buried oxide film 143 may be etched forming a buried oxide film 143 having a surface that may be substantially matched with a surface of the gate oxide film 130.

Referring now to FIG. 12(b), the remaining nitride film 105 in the stacked film 117 may be removed with etching so that an underlay oxide film 102 may be exposed.

Referring now to FIG. 12(c), the remaining underlay oxide film 102 of the stacked film 117 may be removed.

Referring now to FIG. 13(a), the exposed semiconductor substrate 101 may be subjected to thermal oxidation to form a tunnel oxide film 172. Then, polysilicon 153 may be deposited. Polysilicon 153 may be used as a floating gate electrode material and may have a film thickness of approximately 50 to 150 nm.

Referring now to FIG. 13(b), polysilicon 153 may be patterned and etched to form a floating gate electrode 163. Floating gate electrode 163 may entirely cover tunnel oxide film 172 and gate oxide film 172 and may have ends that extend over the buried oxide film 193.

Referring now to FIG. 13(c), a capacitor film 164 may be formed on the surface including floating gate electrode 163. Capacitor film 164 may include a stacked structure of an oxide film/nitride film/oxide film (ONO film). Next, a control gate electrode 165 may be formed. In this way, a flash memory cell structure of the third embodiment may be obtained as illustrated in FIG. 13(c).

In addition to the high reliability of the flash memory cell structure described in the first embodiment, a high capacitance ratio may be achieved by increasing an area of the floating gate electrode as compared to the first embodiment. Thus, a reduction in writing and erase voltage may be achieved.

Also, in the second embodiment, it may be difficult to uniformly bury an organic material such as a resist in the recess portion in order to form the shape of the floating gate electrode (FIGS. 9(c) and 10(a)) thus the manufacturing process may be complicated. However, in the present embodiment, the process control may be consistently facilitated so that the manufacturing process may be simplified.

In the embodiments described above, a flash memory has been given as an example, however the present invention is not limited as such. The present invention may be applicable to semiconductor devices other than a flash memory.

As described above, according to a semiconductor device and its manufacturing method of the present invention, a stacked structure may be formed on an active gate film region. The gate film under regions of the stacked structure that are closer to a trench isolation may be thicker than an active gate film which may be located under a central portion of the stacked structure. In this way, a distance between a shoulder portion of a trench and a gate electrode may be increased. This may eliminate undesirable characteristics that may be caused by an electric field concentration in the shoulder portion of the trench. Because the gate film located in the region closer to the trench isolation may be formed thickly, a capacitance ratio of a control capacitance to a substrate capacitance may be increased.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A manufacturing method of a semiconductor device, comprising the steps of:

forming a first oxide film on a surface of a semiconductor substrate;

depositing a stacked film including a first conductive layer in contact with the first oxide film;

etching the stacked film and the first oxide film to form a plurality of stacked film patterns arranged on the semiconductor substrate;

oxidizing the semiconductor substrate to form a second oxide film on a surface of the semiconductor substrate sandwiched between adjacent said stacked film patterns and a surface of the semiconductor substrate below end portions of the stacked film patterns wherein the second oxide film has a film thickness thicker than the first oxide film;

forming a side wall mask film on a side of the stacked film patterns to form mask patterns including the stacked film patterns;

removing the portion of the second oxide film sandwiched between the mask patterns and a portion of the underlying semiconductor substrate using the mask patterns as a mask to form a trench in the semiconductor substrate; and filling the trench with an insulating film wherein the stacked film includes a stopper film that provides a stopper for a chemical mechanical polishing step.

2. The manufacturing method of a semiconductor device according to claim 1, wherein:

the step of filling the trench with an insulating film includes forming the insulating film to have a top surface having a height that essentially matches with a height of the second oxide film.

3. The manufacturing method of a semiconductor device according to claim 1, further including the steps of:

forming a capacitance insulating film on the surface including the first conductive layer after the step of filling the trench with an insulating film; and forming an electrode on the capacitance insulating film.

4. The manufacturing method of a semiconductor device according to claim 1, wherein:

the side wall mask film includes a nitride film.

5. The manufacturing method of a semiconductor device according to claim 1, wherein:

the second oxide film is approximately 20 to 50 nm thicker than the first oxide film.

6. The manufacturing method of a semiconductor device according to claim 1, wherein:

the stacked film includes a stopper film that provides a stopper for a chemical mechanical polishing step.

7. A manufacturing method of a semiconductor device, comprising the steps of:

forming a first oxide film on a surface of a semiconductor substrate;

depositing a stacked film different from the first oxide film and including a first layer on the first oxide film;

etching the stacked film and the first oxide film to form a plurality of stacked film patterns arranged on the semiconductor substrate;

oxidizing the semiconductor substrate to form a second oxide film on a surface of the semiconductor substrate sandwiched between adjacent stacked film patterns and a surface of the semiconductor substrate below end portions of the stacked film patterns wherein the second oxide film has a film thickness thicker than the first oxide film;

removing the portion of the second oxide film sandwiched between the stacked film patterns and a portion of the underlying semiconductor substrate using the stacked film patterns as a mask to form a trench in the semiconductor substrate; and filling the trench with an insulating film wherein the step of filling the trench with an insulating film includes forming the insulating film to have a top surface coplanar with the top surface of the first layer.

8. A manufacturing method of a semiconductor device, comprising the steps of;

forming a first oxide film on a surface of a semiconductor substrate;

depositing a stacked film different from the first oxide film and including a first layer on the first oxide film;

etching the stacked film and the first oxide film to form a plurality of stacked film patterns arranged on the semiconductor substrate;

oxidizing the semiconductor substrate to form a second oxide film on a surface of the semiconductor substrate sandwiched between adjacent stacked film patterns and a surface of the semiconductor substrate below end portions of the stacked film patterns wherein the second oxide film has a film thickness thicker than the first oxide film;

removing the portion of the second oxide film sandwiched between the stacked film patterns and a portion of the underlying semiconductor substrate using the stacked film patterns as a mask to form a trench in the semiconductor substrate;

filling the trench with an insulating film;

removing the stacked film patterns so that at least the second oxide film below the stacked film patterns remain;

subsequently forming a gate oxide film in a region between portions of the second oxide film; and forming a first electrode over the gate oxide film and at least a portion of the second oxide film.

9. The manufacturing method of a semiconductor device according to claim 8, wherein:

the first electrode includes end portions next to the insulating film that are higher than a central portion of the first electrode.

10. The manufacturing method of a semiconductor device according to claim 8, wherein:

the insulating film has a top surface even with a top surface of the first electrode.

11. The manufacturing method of a semiconductor device according to claim 8, further including the steps of:

forming a capacitance insulating film on the first electrode; and forming a second electrode on the capacitance insulating film.

12. The manufacturing method of a semiconductor device according to claim 8, wherein:

the first electrode includes polysilicon.

13. The manufacturing method of a semiconductor device according to claim 1, wherein:

the first conductive layer of the stacked film is a transistor gate electrode layer.

* * * * *